(12) United States Patent
Yeh et al.

(10) Patent No.: US 12,087,761 B2
(45) Date of Patent: *Sep. 10, 2024

(54) ELECTRICAL PASSIVE ELEMENTS OF AN ESD POWER CLAMP IN A BACKSIDE BACK END OF LINE (B-BEOL) PROCESS

(71) Applicant: Taiwan Semiconductor Manufacturing Co., Ltd., Hsin-Chu (TW)

(72) Inventors: Yu-Hung Yeh, Hsin-Chu (TW); Wun-Jie Lin, Hsinchu (TW); Jam-Wem Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,472

(22) Filed: Jun. 15, 2023

(65) Prior Publication Data

US 2023/0326920 A1 Oct. 12, 2023

Related U.S. Application Data

(63) Continuation of application No. 17/219,495, filed on Mar. 31, 2021, now Pat. No. 11,728,330.

(51) Int. Cl.
*H01L 27/02* (2006.01)
*H01L 23/522* (2006.01)
*H01L 23/535* (2006.01)
*H02H 9/04* (2006.01)

(52) U.S. Cl.
CPC ...... *H01L 27/0288* (2013.01); *H01L 23/5223* (2013.01); *H01L 23/5228* (2013.01); *H01L 23/535* (2013.01); *H01L 27/0285* (2013.01); *H01L 27/0292* (2013.01); *H02H 9/046* (2013.01)

(58) Field of Classification Search
CPC ............. H01L 27/0288; H01L 23/5223; H01L 23/5228; H01L 23/535; H01L 27/0285; H01L 27/0292; H01L 23/5227; H01L 27/0266; H01L 21/822; H01L 27/0296; H02H 9/046
USPC .......................................................... 361/56
See application file for complete search history.

(56) References Cited

U.S. PATENT DOCUMENTS 11,398,469 B1 * 7/2022 Karp ................... H01L 25/0657
11,728,330 B2 * 8/2023 Yeh ..................... H01L 23/5228
361/56

(Continued)

*Primary Examiner* — Dharti H Patel
(74) *Attorney, Agent, or Firm* — Duane Morris LLP (57) ABSTRACT

An electrostatic discharge (ESD) protection apparatus and method for fabricating the same are disclosed herein. In some embodiments, the ESD protection apparatus, comprises: a plurality of transistors patterned on a semiconductor substrate during a front-end-of-line (FEOL) process, metal interconnects formed on top of the plurality of transistors during a back-end-of-line (BEOL) process and configured to interconnect the plurality of transistors, and a plurality of passive components formed under the semiconductor substrate in a backside layer during a backside a back-end-of-line (B-BEOL) process, wherein the plurality of passive components are connected to the plurality of transistors through a plurality of vias.

20 Claims, 4 Drawing Sheets

(56) References Cited

U.S. PATENT DOCUMENTS

| | | | |
|---|---|---|---|
| 2015/0250058 A1* | 9/2015 | Ramachandran | H01L 23/5384 361/748 |
| 2016/0165730 A1* | 6/2016 | Fu | H01L 25/0657 361/748 |
| 2019/0198458 A1* | 6/2019 | Petzold | H01L 23/535 |
| 2022/0285338 A1* | 9/2022 | Yeh | H01L 27/0292 |

* cited by examiner

ELECTRICAL PASSIVE ELEMENTS OF AN ESD POWER CLAMP IN A BACKSIDE BACK END OF LINE (B-BEOL) PROCESS

CROSS-REFERENCE TO RELATED APPLICATION

This application is a continuation of U.S. patent application Ser. No. 17/219,495, filed Mar. 31, 2021, which is incorporated by reference herein in its entirety.

BACKGROUND

With the advance of integrated circuit (IC) fabrication technologies, more and more circuits are integrated in a single chip. Moreover, a single IC chip can include an ESD protection circuit that is configured to protect the integrated circuits from electrostatic discharge (ESD) events. However, passive elements of the ESD protection circuitry, such as capacitors and resistors of the trigger circuit, may consume a significant amount of area on the IC chip. For example, traditional RC components the ESD protection circuitry may utilize from 15%-30% of silicon area. Circuits such as voltage-controlled oscillators (VCO), analog-to-digital converters (ADC), or filters may also one or more resistances (R), inductances (L), and capacitances (C) their design. As such, the IC chip that integrates various circuits may be area limited due to large amounts of silicon area and layout resources that need to be allocated to passive components.

Since silicon area is a significant cost-controlling factor in IC production, there is a need to reduce the amount of silicon area required by passive components (e.g., ESD protection circuitry). Thus, there is a need to provide a semiconductor structure for passive elements that better utilizes vertical integration and provides an improved on-chip layout area utilization.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAILED DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Figure 1:
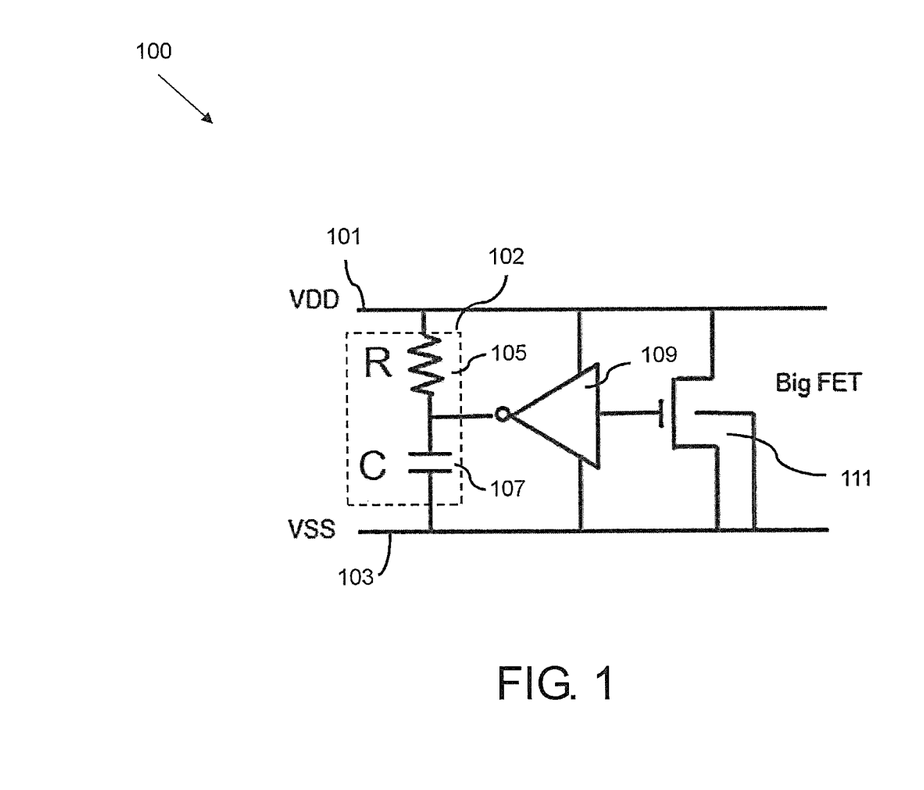
FIG. 1 illustrates a schematic diagram of an ESD power clamp circuit, in accordance with some embodiments.

FIG. 1 illustrates a schematic diagram of an ESD power clamp circuit 100 that can be implemented as part of ESD protection circuitry, in accordance with some embodiments. In some embodiments, the ESD power clamp circuit 100 includes a high-current-capacity field-effect transistor (FET) 111 electrically connected across high (e.g., a VDD pin) and low (e.g., a VSS pin) power supply nodes 101 and 103, respectively. In accordance with other embodiments, the ESD power clamp circuit 100 may include a plurality of high-current-capacity field-effect transistors (FETs) connected in series between the power supply nodes 101 and 103. In further embodiments, the FET transistor 111 may provide a current path for discharging current from the high power supply node 101 during an ESD event. As such, the FET transistor 111 may have a channel width on the order of 2,000 micrometer (μm) to 9,000 micrometer (μm) in order to handle the large current present during an ESD event.

Moreover, as shown in FIG. 1, the ESD power clamp circuit 100 includes an RC trigger network 102 comprising of a capacitor 107 in series with a resistor 105. The RC trigger network 102 is connected between the high and low power supply nodes 101 and 103, respectively. The ESD power clamp circuit 100 may further include an inverter 109 coupled between the RC trigger network 102 and a gate terminal of the FET transistor 111. In some embodiments, the inverter 109 may include two transistors (e.g., PMOS) and (e.g., NMOS) connected in series.

In some embodiments, the ESD protection circuitry may be implemented as an array of the ESD power clamp circuits 100. In further embodiments, the passive components, such resistances, inductances, and capacitances, of the ESD power clamp circuits 100 may be patterned on a backside of a semiconductor wafer during the backside back end-of-line ("BEOL") fabrication process. This embodiment is also explained in further detail below. One exemplary advantage of the above mentioned implementation structure of the ESD power clamp circuit 100 is an increase in routing resources in the interconnect layer of the wafer that may be used for other application specific circuits.

Figure 2:
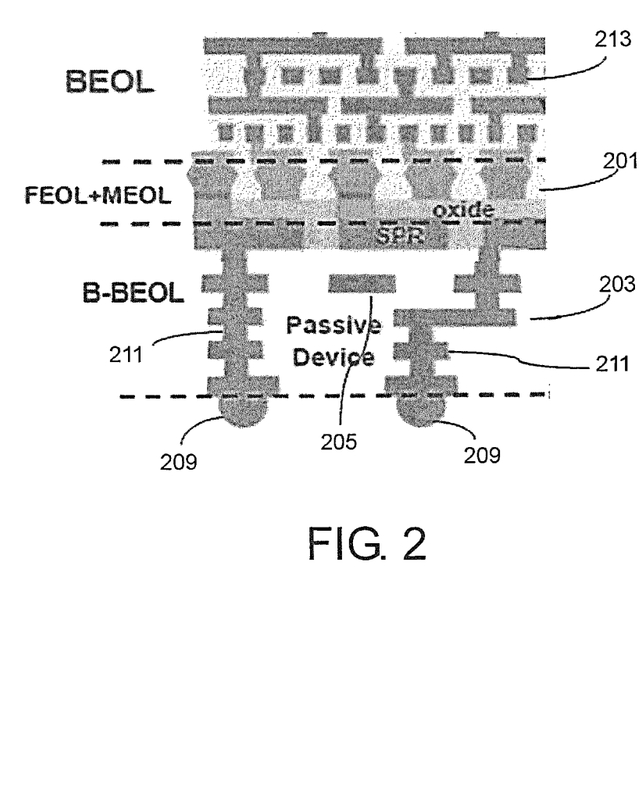
FIG. 2 illustrates a cross-sectional view of an exemplary wafer stack for implementing passive components of the ESD power clamp circuit in a backside layer of the wafer stack, in accordance with to some embodiments.

FIG. 2 illustrates a cross-sectional view of an exemplary wafer stack 200 for implementing passive components of an ESD power clamp circuit 100 in a backside layer 203 of the wafer stack 200, according to some embodiments. In some embodiments, the backside layer 203 may also be used to pattern passive components of voltage-controlled oscillators (VCO), analog-to-digital converters (ADC), or filters.

As shown in FIG. 2, the wafer stack 200 may use a back end-of-line ("BEOL") fabrication process to fabricate a first conductive interconnect layer 213. As such, the first conductive interconnect layer 213 may be used to interconnect components of integrated circuits (ICs) and other microdevices patterned in a front-end-of-line ("FEOL") portion of a FEOL and mid-end-of-line ("MEOL") layer 201. In other embodiments, the first conductive interconnect layer 213 may include contacts (pads), interconnect wires, and vertical conductive paths (vias) suitable for interconnecting the integrated circuits (ICs) and other microdevices patterned fabricated in the FEOL portion of the FEOL and MEOL layer 201. According to one embodiment, the first conductive interconnect layer 213 may also include contacts, insulating layers, multiple metal levels, and bonding sites configured to interconnect integrated circuits and microdevices fabricated in the FEOL portion of the FEOL and MEOL layer 201.

In further embodiments, the BEOL fabrication process may use a conductive material, such as aluminum (Al), copper (Cu) or a Cu-based alloy, to create metallization lines and vias in the first conductive interconnect layer 213. Moreover, in deep-submicron BEOL processes, the first conductive interconnect layer 213 may be insulated using the high-density plasma (HDP) oxide that exhibits a good gap filling capability, low dielectric constant, and a low defect density.

In further embodiments, the wafer stack 200 may use a MEOL fabrication process to fabricate a second conductive interconnect layer. In some embodiments, the second conductive interconnect layer may include gate contacts as well as contact structures fabricated in the source and drain regions of a MEOL portion of a FEOL and MEOL portion of layer 201.

In some embodiments, FEOL portion of the layer 201 may comprises a semiconductor substrate and the interconnect rails that are partially buried in the semiconductor substrate. In some embodiments, the FEOL and MEOL layer 201 is formed under the first conductive interconnect layer 213.

In various embodiments, the wafer stack 200 may include a backside layer 203 may be formed under the front-end-of-line ("FEOL") and mid-end-of-line ("MEOL") layer 201. In some embodiments, the backside layer 203 may be formed using a backside back end-of-line ("B-BEOL") process. In some embodiments, the B-BEOL process may be substantially similar to the BEOL. In further embodiments, the backside layer 203 may include a power delivery network ("PDN") 211 configured to deliver power to the individual integrated circuits and microdevices. In some embodiments, the PDN 211 is formed under the FEOL and MEOL layer 201. Moreover, the power delivery network in the PDN 211 may be connected to the buried interconnect rails of the FEOL and MEOL layer 201 by way of metal-filled TSVs (Through-Semiconductor Vias) or by way of damascene-type contacts. Moreover, the FEOL and MEOL layer 201 may also include layer interconnect vias configured to route signals from the PDN 211 to the first conductive interconnect layer. In some embodiments, the layer interconnect vias may be shielded from the integrated circuits and their interconnections formed in the FEOL and MEOL layer 201.

In some embodiments, the backside layer 203 may include one or more metal interconnect levels. As such, the one or more metal interconnect levels of backside layer 203 may be composed of copper (Cu), aluminum (Al) or an alloy thereof such as, for example, a Cu—Al alloy. The one or more metal interconnect levels can be formed utilizing a deposition process such as, for example, CVD, PECVD, sputtering, chemical solution deposition or plating.

As illustrated in FIG. 2, passive component 205 may be patterned in the backside layer 203. In some embodiments, the passive component 205 may be an inductor, capacitor, resistor, or a networks comprising of interconnected inductors, capacitors, and resistors. For example, the passive component 205 may be a planer resistor. As another example, the passive component 205 may be a vertical resistance with a tunable resistance values located between the metal interconnect levels. In yet another example, the passive component 205 may be a vertical parallel plate Metal-Oxide-Metal (MOM) capacitor formed on the one or more metal interconnect levels. In some embodiments, the MOM capacitor may be patterned using multiple interdigitated fingers formed on the one or more metal interconnect levels. In further embodiments, the fingers forming the MOM capacitor may be connected by vias. One exemplary advantage of fabricating passive components 205 in the backside layer 203 is an increase in the routing resources that allows integration of more functionality into the FEOL and MEOL layer 201 and the first conductive interconnect layer 213.

In further embodiments, the wafer stack 200 may also include multiple solder bump terminals 209, called bump pads, which are used as the input/output (I/O) terminals as well as power supply (VDD and VSS) contacts. In one embodiment, the solder bump pads 209 may be formed over the bottom surface of the backside layer 203. In some embodiments, the solder bump pads 209 may be linearly aligned bump pad arrays, where each linearly aligned bump pad array may have one or more I/O bump pads, one or more VDD bump pads, and one or more VSS bump pads. In some embodiments, ESD protection circuitry can be formed in the backside layer 203, as described in further detail below.

Figure 3:
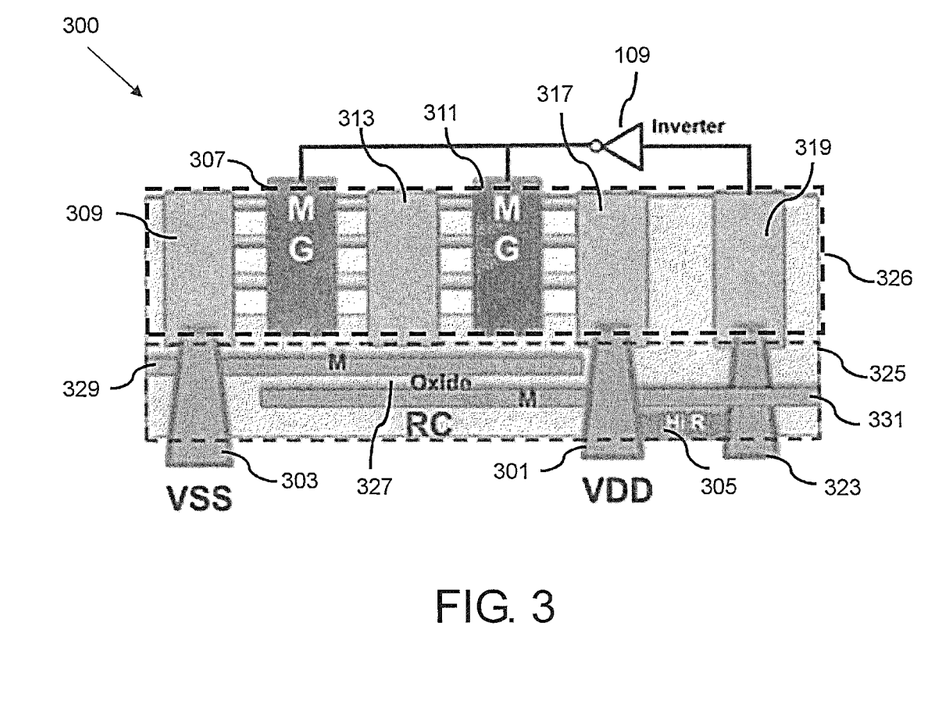
FIG. 3 illustrates a cross-sectional view of the ESD power clamp circuit with the trigger network implemented in a backside layer, in accordance with some embodiments.

FIG. 3 illustrates a cross-sectional view of the ESD power clamp circuit 100 with the trigger network 102 (FIG. 1) implemented in a backside layer 325, in accordance with some embodiments. In some embodiments, the backside layer 325 may be formed below the FEOL layer 326, which includes integrated circuits and microdevices. In further embodiments, the backside layer 325 may have multiple layers and may be formed by any method known in the art, including, but not limited to, chemical vapor deposition, sputter deposition, plating, and the like. The backside metallization layer 325 may comprise multiple layers of material and in some embodiments comprises one or more layers of aluminum (Al), copper (Cu), or titanium, a layer silicon dioxide ($SiO_2$), and a layer of high-resistance polysilicon.

As shown in FIG. 3, the capacitor 107 (FIG. 1) of the trigger network 102 may be patterned in the backside layer 325. As such, the capacitor 107 may be patterned as a metal-oxide-metal (MOM) capacitor comprising a first metal structure 329 connected to the power supply VSS contact 303 and a second metal structure 331 connected to a first terminal of a resistor 305. In some embodiments, the first and second metal structures 329 and 331 may be separated by an oxide layer 327. In some embodiments, the oxide layer 327 may be formed from a material exhibiting a high-K dielectric constant. For example, the oxide layer 327 may be a silicon oxide-based material, such as an undoped silicate glass (USG), fluorinated silicate glass (FSG), or plasma enhanced chemical vapor deposition (PECVD) silicon oxide. As further shown in FIG. 3, the resistor 305 of the trigger network 102 (FIG. 1) may be patterned in the backside layer 325. In some embodiment, a second terminal of the resistor 305 may be connected to the power supply VDD contact 323. In further embodiments, the resistor 305 may be a high-resistance polysilicon resistor.

In some embodiments, the first terminal of the resistor 305 and second metal structure 331 of the MOM capacitor 107 may be connected to a first via 323, which, subsequently, is connected to an input of the inverter 109 through a second via 319. In some embodiments, the second via 319 may be a through-silicon via (TSV). In some embodiments, the first via 323 may have a tapered profile with a narrow end exposed to a bottom surface of the second via 319 and its wide end exposed to the first terminal of the resistor 305.

In further embodiments, the high-current-capacity FET 111 of the ESD power circuit 100 (FIG. 1) may be constructed as two FETs connected in series. For example, a gate 307 of a first FET and a gate of a second FET 311 may be controlled by the inverter 109. Moreover, a drain of the first FET and a source of the second FET are patterned as a shared region 313. Furthermore, a drain of the second FET may be connected to a tapered via 301, formed in the backside layer 325 and connected to the power supply VDD node 101, through a TSV 317. In addition, a source of the first FET may be connected to a tapered via 303, formed in the backside layer 325 and connected to the power supply VSS node 103, through a TSV 309.

In other embodiments, the high-current-capacity FET 111 of the ESD power circuit 100 may be constructed as a FinFET device with multiple gates. For example, an output of the inverter 109 may be connected to the multiple gates of the FinFET device. Moreover, the FinFET device the multiple gates may be crossing over fins. In some embodiments, the multiple gates may be separated from the fins by a dielectric layer.

In further embodiments, passive components of various other integrated circuits such as VSOs, ADCs, or filters may also be patterned in the backside layer 325 and thereby freeing routing resources and allowing integration of more functional circuits.

Figure 4:
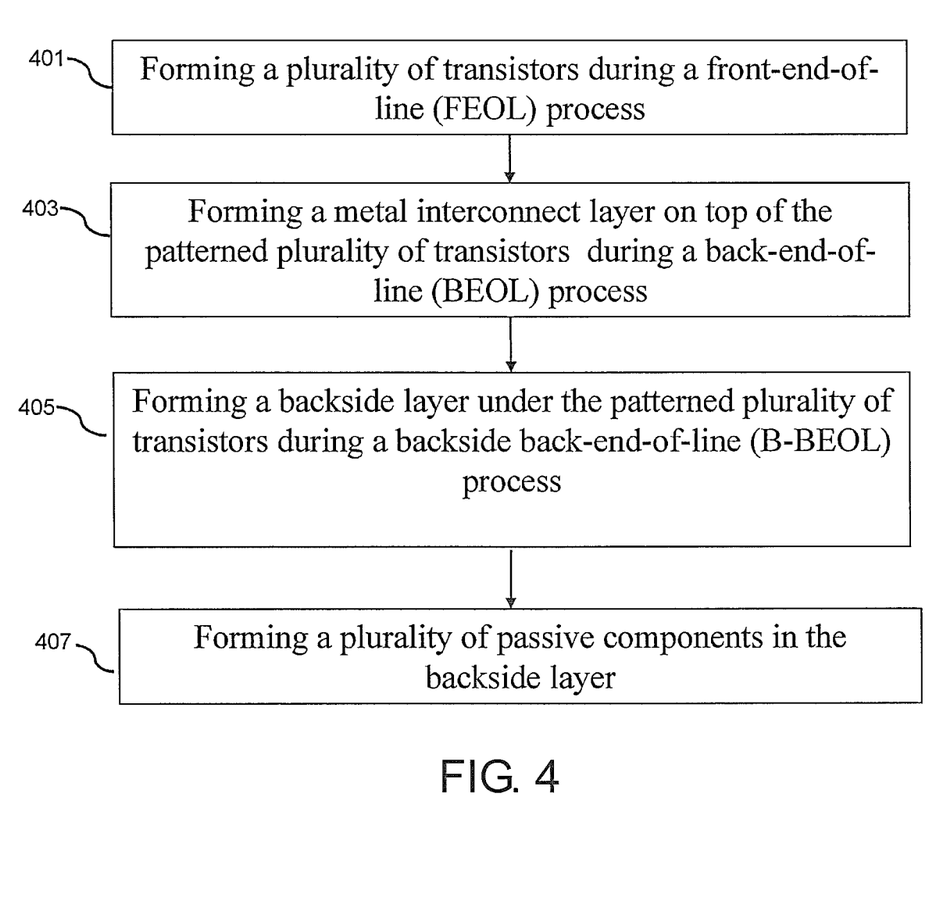
FIG. 4 illustrates a flow diagram of a method of forming an electrostatic discharge (ESD) power clamp device, in accordance with some embodiments.

FIG. 4 illustrates a flow diagram of a method of forming an electrostatic discharge (ESD) power clamp device, in accordance with some embodiments. Although the exemplary method shown in FIG. 4 is described in relation to FIGS. 1-3, it will be appreciated that this exemplary method is not limited to such structures disclosed in FIGS. 1-3 and may stand alone independent of the structures disclosed in FIGS. 1-3. In addition, some operations of the exemplary method illustrated in FIG. 4 may occur in different orders and/or concurrently with other operations or events apart from those illustrated and/or described herein. Moreover, not all illustrated operations may be required to implement one or more aspects or embodiments of the present disclosure. Further, one or more of the operations depicted herein may be carried out in one or more separate operations and/or phases.

At operation 401, a plurality of transistor devices (e.g., FET 111 of FIG. 1) may be formed during a front-end-of-line (FEOL) process. In some embodiments, during the FEOL process, the layer 201 (FIG. 2) may be formed which may comprise of a semiconductor substrate and patterned transistors as well as through-silicon vias (TSVs). In some embodiments, the patterned transistor devices may be part of an ESD power claim circuit, VSO, ADC, or filter.

At operation 403, a metal interconnect layer may be formed during a back-end-of-line (BEOL) process. In some embodiments, the metal interconnect layer may be used to interconnect components of the plurality of transistors and other microdevices patterned during the FEOL process. In other embodiments, the metal interconnect layer may include contacts (pads), interconnect wires, and vertical conductive paths (vias) suitable for interconnecting the plurality of transistors. According to one embodiment, the metal interconnect layer may also include contacts, insulating layers, multiple metal levels, and bonding sites configured to interconnect the plurality of transistors. In further embodiments, during the operation 403, a conductive material, such as aluminum (Al), copper (Cu) or a Cu-based alloy, may be used to create metallization lines and vias.

At operation 405, a backside layer may be formed under the patterned plurality of transistor devices formed during the FEOL process at operation 401. More specifically, the backside layer may be formed at a bottom surface of a semiconductor surfaced used for patterning the plurality of transistors. In some embodiments, the backside layer may be formed by a backside back-end-of-line (B-BEOL) process that is substantially similar to the BEOL process. In some embodiments, the backside layer may include a power delivery network (PDN) layer that is configured to deliver power to the plurality of transistor devices formed during the operation 401. In some embodiments, the one or more metal interconnect levels comprising of copper (Cu), aluminum (Al) or an alloy thereof such as, for example, a Cu—Al alloy may be formed in the backside layer. In addition, the one or more metal interconnect levels can be formed utilizing a deposition process such as, for example, CVD, PECVD, sputtering, chemical solution deposition or plating.

At operation 407, a plurality of passive components may be formed in the backside layer. In some embodiments, the plurality of passive components may be inductors, capacitors, resistors, or a networks comprising of interconnected inductors, capacitors, and resistors. For example, the passive component 205 (FIG. 2) may be formed in the backside layer. In some embodiments, the plurality of passive components may be planer resistors. In yet another embodiment, the plurality of passive components may be vertical parallel plate Metal-Oxide-Metal (MOM) capacitors formed on the one or more metal interconnect levels of the backside layer. In some embodiments, the MOM capacitor may be patterned using multiple interdigitated fingers formed on the one or more metal interconnect levels. In further embodiments, the fingers forming the MOM capacitor may be connected by vias. In some embodiments, the plurality of passive components formed in the backside layer provide on-chip ESD protection circuitry for the IC chip.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An apparatus comprising:
    a plurality of transistors formed on a semiconductor substrate;
    an inverter having an output coupled to respective gates of the plurality of transistors; and
    a plurality of passive components formed under the semiconductor substrate in a backside layer,
    wherein the plurality of passive components comprises a resistor and a metal-oxide-metal (MOM) capacitor, wherein a first terminal of the resistor and a first metal structure of the MOM capacitor are connected, through a through-silicon via (TSV) extending through the backside layer, to an input of the inverter.

2. The apparatus of claim 1, wherein the backside layer comprises of one or more metal interconnect levels that are separated by one or more dielectric layers.

3. The apparatus of claim 2, wherein the MOM capacitor is formed on the one or more metal interconnect levels.

4. The apparatus of claim 2, wherein the resistor comprises a polysilicon resistor on at least one of the one or more metal interconnect levels.

5. The apparatus of claim 3, wherein the MOM capacitor comprises first and second metal structures separated by a material exhibiting a high-K dielectric constant.

6. An electrostatic discharge (ESD) protection device comprising:
    a plurality of transistors formed on a semiconductor substrate, wherein the plurality of transistors are configured to clamp an ESD voltage during an ESD event so as to protect integrated circuits patterned on the semiconductor substrate from the ESD event;

an inverter having an output coupled to respective gates of the plurality of transistors; and a trigger network comprising of a capacitor connected in series with a resistor and formed under the semiconductor substrate in a backside layer, wherein a first terminal of the resistor and a first metal structure of the capacitor are connected, through a first through-silicon via (TSV) extending through the backside layer, to an input of the inverter.

7. The electrostatic discharge (ESD) protection device of claim 6, wherein the trigger network is electrically connected between a high power supply rail and a low power supply rail, and wherein the plurality of transistors are connected in series between the high power supply rail and a low power supply rail and configured to provide a current path between the high power supply rail and a low power supply rail during the ESD current.

8. The electrostatic discharge (ESD) protection device of claim 6, wherein the backside layer comprises of one or more metal interconnect levels that are separated by one or more dielectric layers.

9. The electrostatic discharge (ESD) protection device of claim 8, wherein the capacitor is a parallel plate Metal-Oxide-Metal (MOM) capacitor formed on the one or more metal interconnect levels.

10. The electrostatic discharge (ESD) protection device of claim 9, wherein the MOM capacitor comprises first and second metal structures that are separated by a material exhibiting a high-K dielectric constant.

11. The electrostatic discharge (ESD) protection device of claim 9, wherein the resistor is formed from a polysilicon material on at least one of the one or more metal interconnect levels.

12. The electrostatic discharge (ESD) protection device of claim 10, wherein the first metal structure of the MOM capacitor is connected to the low power supply rail and the second metal structure is connected to the first terminal of the resistor.

13. The electrostatic discharge (ESD) protection device of claim 12, wherein a second terminal of the resistor is connected to the high power supply rail.

14. The electrostatic discharge (ESD) protection device of claim 12, further comprising a second TSV extending through the semiconductor substrate, wherein the second TSV electrically couples the first TSV to the input of the inverter.

15. A method of forming an electrostatic discharge (ESD) protection device comprising:

forming a plurality of transistors on a semiconductor substrate, wherein the plurality of transistors are configured to clamp an ESD voltage during an ESD event so as to protect integrated circuits patterned on the semiconductor substrate from the ESD event;

forming an inverter having an output coupled to respective gates of the plurality of transistors, wherein the metal interconnects are configured to interconnect the plurality of transistors and the integrated circuits;

forming a trigger network comprising of a capacitor connected in series with a resistor, wherein the trigger network is formed under the semiconductor substrate, and wherein the trigger network is electrically connected between a high power supply rail and a low power supply rail, and wherein a first terminal of the resistor and a first metal structure of the capacitor are connected to an input of the inverter; and forming an electrical connection, through vias, between a first metal structure of the capacitor and the low power supply rail and between a second metal structure of the capacitor and the first terminal of the resistor.

16. The method of claim 15, further comprises:

forming one or more metal interconnect levels in a backside layer that are separated by one or more dielectric layers.

17. The method of claim 16, wherein the capacitor is formed on the one or more metal interconnect levels.

18. The method of claim 17, wherein first and second metal structures of the capacitor are separated by a material exhibiting a high-K dielectric constant.

19. The method of claim 16, further comprises:

forming the resistor from a polysilicon material on at least one of the one or more metal interconnect levels.

20. The method of claim 15, wherein a second terminal of the resistor is connected to the high power supply rail.

* * * * *